(12) United States Patent
Bagung et al.

(10) Patent No.: US 10,440,844 B2
(45) Date of Patent: Oct. 8, 2019

(54) CIRCUIT BOARD ASSEMBLY

(71) Applicant: CONTINENTAL AUTOMOTIVE GMBH, Hannover (DE)

(72) Inventors: Detlev Bagung, Bernhardswald (DE); Christian Pump, Kirchdorf (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/767,738

(22) PCT Filed: Aug. 29, 2016

(86) PCT No.: PCT/EP2016/070288
§ 371 (c)(1),
(2) Date: Apr. 12, 2018

(87) PCT Pub. No.: WO2017/063782
PCT Pub. Date: Apr. 20, 2017

(65) Prior Publication Data
US 2018/0295730 A1    Oct. 11, 2018

(30) Foreign Application Priority Data
Oct. 15, 2015   (DE) .................... 10 2015 220 047

(51) Int. Cl.
*H05K 5/00*        (2006.01)
*H01R 12/72*       (2011.01)
(Continued)

(52) U.S. Cl.
CPC ......... *H05K 5/0069* (2013.01); *H01R 12/724* (2013.01); *H05K 1/028* (2013.01);
(Continued)

(58) Field of Classification Search
USPC ......................................................... 361/752
See application file for complete search history.

(56) References Cited

U.S. PATENT DOCUMENTS 5,265,322 A * 11/1993 Fisher .................... H05K 1/028
29/832
6,275,385 B1 * 8/2001 Sahara ................. H05K 5/0039
361/679.54
(Continued)

FOREIGN PATENT DOCUMENTS

DE           4303908 A1    8/1994
EP           1152649 A2    11/2001
(Continued)

*Primary Examiner* — Hung S. Bui
(74) *Attorney, Agent, or Firm* — Laurence A. Greenberg; Werner H. Stemer; Ralph E. Locher

(57) ABSTRACT

A circuit board assembly for a control unit of a motor vehicle has a multi-layer circuit board and a plug connector with a housing faceplate. The circuit board, which includes conductor paths for conducting signals, has a first section, a second section, and a flexible third section with a lower stiffness between the first and second sections. The first section encloses an angle φ with the second section. The plug connector has a multiplicity of connection elements, each with an attachment part and a contact pin. The housing faceplate has first and second side panels each enclosing an angle β with the first panel central plane and an angle γ with the second panel central plane. A first detent element prevents a change in the angle φ in a first direction of rotation. A second detent element prevents a change in the angle φ in a second direction of rotation.

14 Claims, 3 Drawing Sheets

(51) Int. Cl.
*H05K 1/02* (2006.01)
*H05K 1/18* (2006.01)
*H05K 5/06* (2006.01)

(52) U.S. Cl.
CPC ............... *H05K 1/18* (2013.01); *H05K 5/006* (2013.01); *H05K 5/0017* (2013.01); *H05K 5/0082* (2013.01); *H05K 5/069* (2013.01); *H05K 2201/10189* (2013.01)

(56) References Cited

U.S. PATENT DOCUMENTS

| | | | |
|---|---|---|---|
| 6,655,017 | B1 | 12/2003 | Formwalt, Jr. et al. |
| 7,656,674 | B2 * | 2/2010 | Wetzel ................ F16H 61/0006 361/752 |
| 2014/0120749 | A1 * | 5/2014 | Drew .................... H01R 12/71 439/78 |

FOREIGN PATENT DOCUMENTS

| | | |
|---|---|---|
| EP | 2728983 A1 | 5/2014 |
| WO | 2013098377 A2 | 7/2013 |

* cited by examiner

CIRCUIT BOARD ASSEMBLY

BACKGROUND OF THE INVENTION

Field of the Invention

The invention relates to a circuit board for arrangement in a housing, in particular for a control unit in a vehicle, as claimed. The present invention also relates to a control unit of a vehicle as as claimed.

Circuit boards generally have electrical and optical conductor paths which are generally connected by means of one or more plug connections to various lines, for example to the wiring loom (wire harness) of a vehicle. The plug connections on the circuit boards produce the connection between the circuit on the circuit boards and the supply and signal lines. The circuit boards are often integrated in a housing.

The terminals of the circuit boards are often formed by one or more plug outputs, wherein the plug device has a plug with electrically conductive contact pins. Said plug outputs may be oriented on the circuit board in various directions with respect to the circuit board. Thus, depending on the usage situation, there is a demand for the plug output to be oriented upward perpendicular to the circuit board plane, to the side parallel to the circuit board plane, and/or obliquely toward the circuit board plane.

The mounting of the terminals on the circuit board is realized by means of various methods. For example, the electrical terminal pins (pins) of the plug device are soldered into the circuit board or are connected to the rigid circuit board by being pressed in (so-called press-fit pins) in order to produce an electrical and mechanical connection to the circuit board. Depending on the design of the plug, the terminal pins may also be bent in a periscope-like manner in order, for example, to realize a lateral plug output. The pressing of the terminal pins into the circuit board is performed in a separate production step. Owing to the pressing-in, it is generally not possible for surface-mountable components (so-called SMD (Surface Mounted Device) components) to be mounted in the region of the plug.

Circuit boards are basically known which are manufactured from a rigid material and which have a planar areal form. In order for the space in the interior of a housing to be utilized as effectively as possible, multiple relatively small circuit boards are arranged in three-dimensional space within the housing and fastened in the housing. The small circuit boards are then connected to one another in electrically conductive fashion by means of plug connections and/or soldered connections. For the fastening of the circuit boards in the housing, the circuit boards are, for example with the housing open, plugged into apertures provided for the purpose in the interior of the housing. As a result of the housing being closed (generally by virtue of two housing halves being joined together), the circuit boards are held firmly in the apertures and are thus fastened in the housing.

For the case of a lateral plug output, in the case of which the contact pins are oriented parallel to a central plane of the circuit board, there are substantially two variants.

Firstly, terminal pins that have already been angled may be used, which may necessitate angling the non-angled standard terminal pins using corresponding additional tooling, and pressing the angled terminal pins into the circuit board using special machines.

Secondly, EP 2 728 983 A1, for example, has disclosed circuit boards with multiple rigid sections which are connected to one another by means of flexible conductor path regions. Here, it has proven to be disadvantageous that the angle $\varphi$ between the circuit board sections can be changed as a result of external forces or as a result of restoring forces.

SUMMARY OF THE INVENTION

It is therefore the object of the present invention to specify a circuit board assembly with an areal form of the circuit board assembly which is adaptable to the inner surfaces of the housing component, which circuit board assembly, by contrast to the present prior art, has none of the abovementioned disadvantages, is structurally and functionally improved, and permits simpler manufacture.

The object is achieved by means of a circuit board assembly as claimed and by means of a control unit as claimed. Advantageous embodiments are specified in the dependent claims.

A circuit board assembly of said type for a control unit of a motor vehicle has a multi-layer circuit board and a plug connector with a housing faceplate. The circuit board comprises optical conductor paths and/or electrical conductor paths for conducting optical and/or electrical signals and has a first panel-like section, a second panel-like section, and a flexible third section which is formed between the first section and the second section and which has a lower stiffness than the first section and the second section and which mechanically and electrically connects said first section and second section such that a first panel central plane of the first section encloses an angle $\varphi$ with a second panel central plane of the second section. The plug connector has a multiplicity of connection elements with in each case one attachment part and one contact pin, wherein the attachment parts are arranged in a common enclosure which projects out of the housing faceplate, and the contact pins are electrically and mechanically connected to the second section. The housing faceplate has a first and a second panel-like side element, wherein the panel central planes of the side elements enclose an angle $\beta$ with the first panel central plane and in each case an angle $\gamma$ with the second panel central plane. At least one of the two side elements has at least one first detent element, wherein the first detent element is designed to lock the housing faceplate on the first section of the circuit board such that acting restoring forces of the third section are accommodated and a change in the angle $\varphi$ in a first direction of rotation is prevented. It is provided according to the invention that at least the first and/or the second side element has a second detent element, wherein the second detent element is designed to prevent a change in the angle $\varphi$ in a second direction of rotation. The first and the second direction of rotation are in particular opposite to one another.

In an advantageous embodiment of the invention, the first detent element and the second detent element are arranged on the side element so as to receive between them the panel central plane of the first section.

The angle $\varphi$ advantageously has a value between 10° and 170°, preferably between 30° and 150°, particularly preferably between 70° and 110°.

In a particularly preferred embodiment, the side elements have at least one sealing element for the sealing of the circuit board assembly with respect to a corresponding housing component of the control unit. It is advantageous here for the sealing element to be designed as an insert seal. Alternatively, the sealing element may be molded onto the side elements or onto the corresponding housing component of the control unit or applied as a dispenser seal directly to the side elements or to the corresponding housing component of the control unit.

The first section of the circuit board is preferably, in a plan view of its first panel central plane, arranged between the first side section and the second side section. It is furthermore advantageous if, in a plan view of the first panel central plane of the first section, the first and the second side element run parallel to those side edges of the first section which adjoin the third section. The second section preferably has, in a plan view of its second panel central plane, a substantially rectangular outline. Alternatively, the outline of the second section may also be of trapezoidal form.

It is provided according to the invention that the circuit board has at least one electrical component which is connected to at least one electrical conductor path, wherein the electrical component is connected to the circuit board in the second section. The electrical component is advantageously a surface-mounted component (SMD, Surface Mounted Device). In one embodiment of the invention, the electrical component may be a plug, and here, the electrical component may in particular be formed as a solder plug or as a press-fit plug, since the circuit board assembly according to the invention does not involve any restriction at all in this regard in the design of the plug.

A further subject of the invention is a control unit, in particular a control unit in a Byte flight bus system of a vehicle, having a housing component and having a circuit board assembly according to the invention arranged in the housing component. It is advantageous here if the housing component of the control unit is closed in hermetically sealed fashion. A sealing element is correspondingly arranged between the housing component and the circuit board assembly. The sealing element may be molded onto the side elements or onto the corresponding housing component of the control unit or applied in the form of a dispenser seal directly to the side elements or to the corresponding housing component of the control unit.

A signal processing arrangement for a motor vehicle is also a subject of the present invention. The signal processing arrangement has a circuit board assembly as described above and has a wiring loom connected to the plug connector, wherein the wiring loom is connected in electrically conductive fashion to the second section by means of at least one connection element.

Further features, possible uses and advantages of the invention will emerge from the following description of the exemplary embodiments of the invention, which are illustrated in the figures. It is to be noted here that the illustrated features are merely of a descriptive nature and may also be used in combination with features of other developments described above and are not intended to restrict the invention in any form.

BRIEF DESCRIPTION OF THE SEVERAL VIEWS OF THE DRAWING

The invention will be discussed in more detail below on the basis of preferred exemplary embodiments, wherein the same reference designations are used for identical features. In the drawings, in each case in schematic form.

DESCRIPTION OF THE INVENTION

Figure 1:
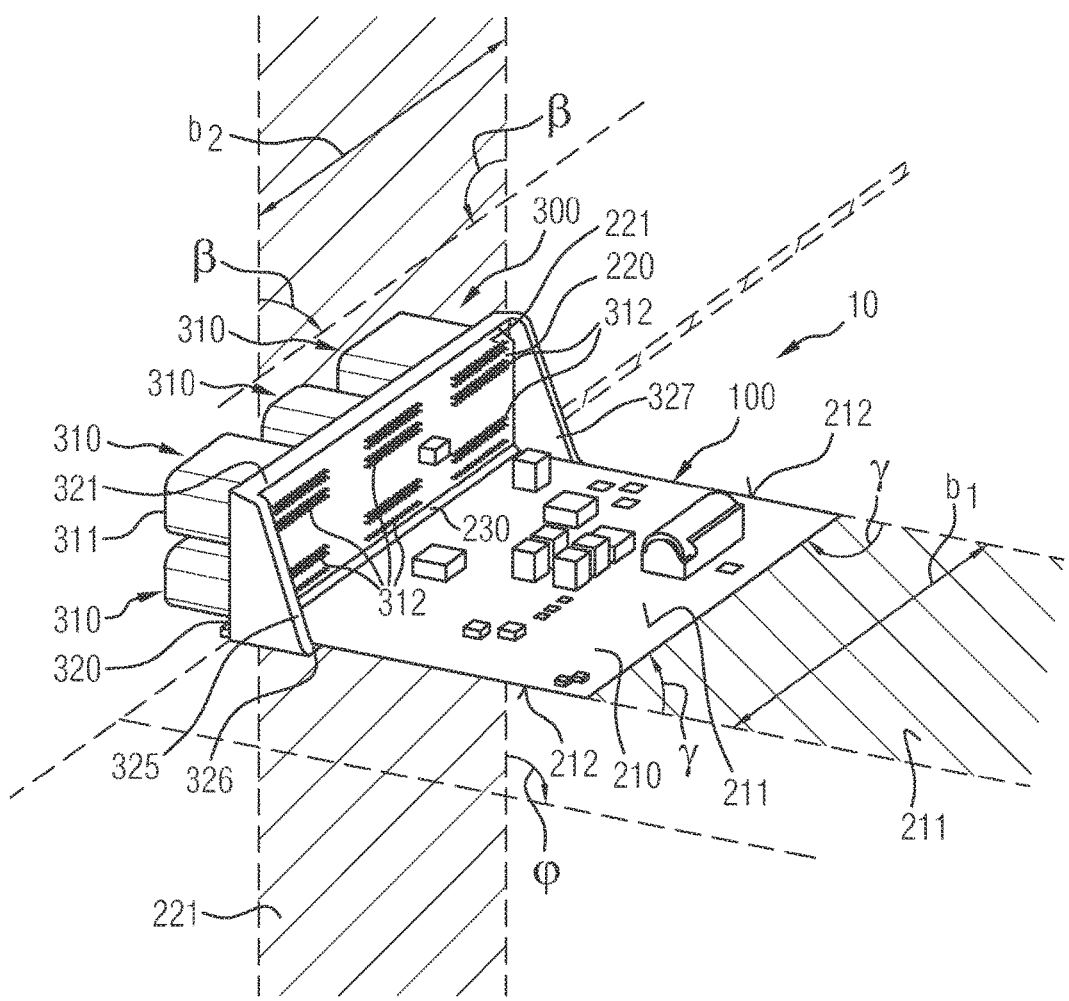
FIG. 1 is a perspective illustration of a circuit board assembly.

FIG. 1 shows a schematic perspective view of a circuit board assembly 10 with a lateral plug connector 300 with a housing faceplate 320. The circuit board 100 has a first panel-like section 210, a second panel-like section 220 and a third section 230, which is arranged between the first section 210 and the second section 220 of the circuit board 100 and which mechanically and electrically connects said first section and second section to one another.

The second section 220 and the first section 210 have substantially the same width b1 and b2 respectively. The first section 210 of the circuit board 100 is arranged between the first side element 325 and the second side element 327. In the illustrated design variant, the second section 220 has a substantially rectangular outline. Here, the width is the lateral extent perpendicular to the direction in which the first section 210, the third section 230 and the second section 220 follow one another in the stretched-out state of the circuit board 100. Alternatively, the outline of the second section 220 may also be of trapezoidal form. The third section 230 may have the same width b1, b2 as the second section 220 and as the first section 210. Alternatively, the width of the third section 230 may however also be smaller, for example in order to set the flexibility of the third section 230. The third section 230 is of flexible form and has a lower stiffness than the first section 210 and the second section 220. The first section 210 and the second section 220 are mechanically and electrically connected to one another by means of the third section 230. The second section 220 of the circuit board 100 is, in the installed state in the circuit board assembly 10, curved such that a first panel central plane 211 of the first section 210 encloses an angle $\varphi$ with a second panel central plane 221 of the second section 220.

The electrical connection is produced for example by means of differently arranged conductor paths (not illustrated in detail) which run from the first section 210 to the second section 220 through the third section 230. The plug connector 300 is situated in the region of the second section 220 and has a multiplicity of connection elements 310.

The connection elements 310 comprise in each case one attachment part 311 and one contact pin 312, wherein the contact pins 312 are electrically and mechanically connected to the second section 220. The housing faceplate 320 has a first panel-like side element 325 and a second panel-like side element 327, wherein the panel central planes of the side elements 325, 327 enclose an angle $\beta$ with the first panel central plane 211 of the first section 210 and in each case an angle $\gamma$ with the second panel central plane 221 of the second section 220. After the bending, the third section 230 is, owing to its relatively low stiffness, dimensionally unstable such that at least one of the two side elements 325, 327, but preferably both side elements 325, 327, has/have at least one first detent element 326 for stabilizing the third section 230. By means of the first detent element 326, the housing faceplate 320 can be locked on the first section 210 of the circuit board 100 such that any acting restoring forces of the third section 230 are absorbed. A change in the angle $\varphi$ in a first direction of rotation, or an increase of the angle $\varphi$, can thus be prevented in an effective manner, such that the circuit board assembly 10 remains in the curved shape by means of the first detent element 326. The angle $\varphi$ has a value between 10° and 170°, preferably between 30° and 150°, particularly preferably between 70° and 110°.

The first and the second side element 325, 327 run parallel to those side edges 212 of the first section 210 which adjoin the third section 230. Furthermore, the side elements 325, 327 have at least one sealing element 321 for the sealing of the circuit board assembly 10 with respect to a corresponding housing component 50 of the control unit 1. The sealing element 321 may be molded as an insert seal or, as illustrated, directly onto the side elements 325, 327 or onto the corresponding housing component 50 of the control unit 1. Alternatively, the sealing element 321 may also be applied as a dispenser seal directly onto the side elements or to the corresponding housing component of the control unit.

Figure 2:
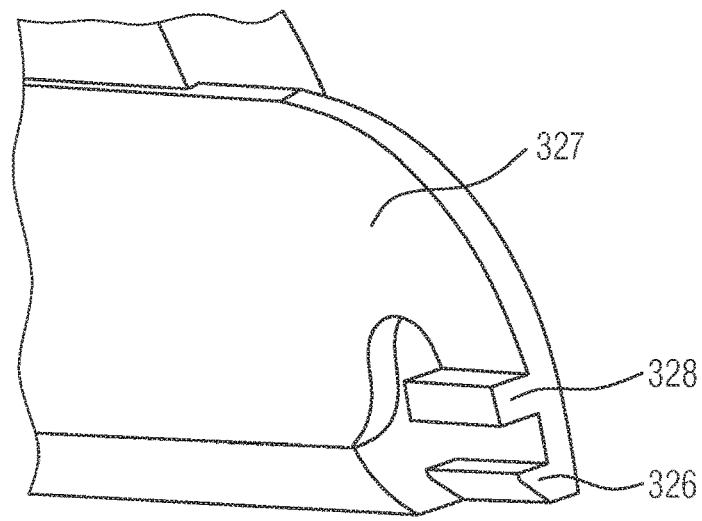
FIG. 2 is a perspective illustration of a side section as per a first exemplary embodiment.
Figure 3:
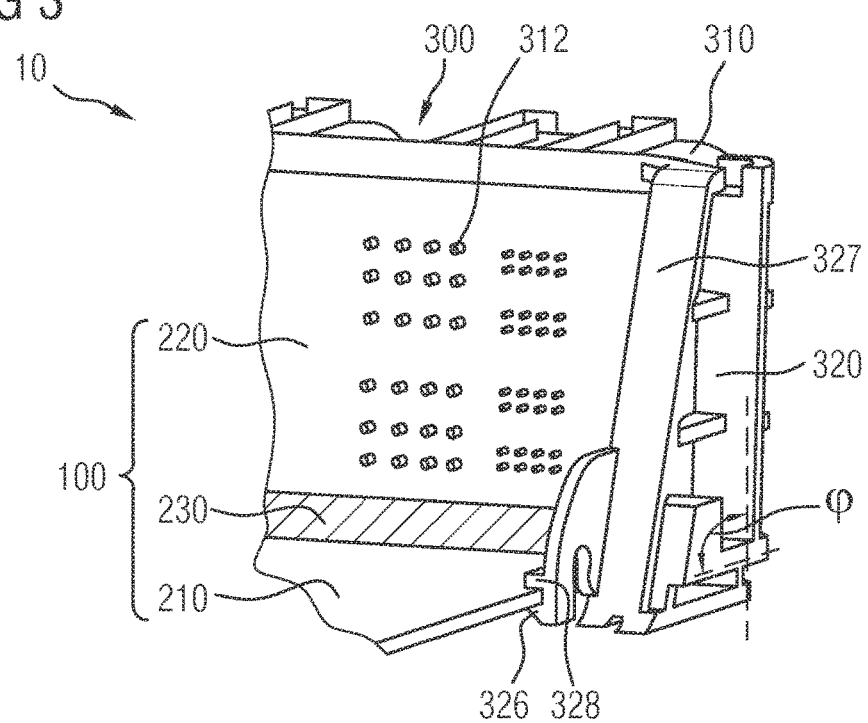
FIG. 3 is a perspective illustration of the side section from FIG. 2 on a circuit board.

As illustrated in detail in FIGS. 2 and 3, the second side element 327, but preferably both side elements 325, 327, has/have in each case one second detent element 328 which is designed to prevent a change in the angle φ in a second direction of rotation, or a decrease of the angle φ. The first detent element 326 and the second detent element 328 are arranged on the side element 327 so as to receive between them the panel central plane 211 of the first section 210.

Figure 4:
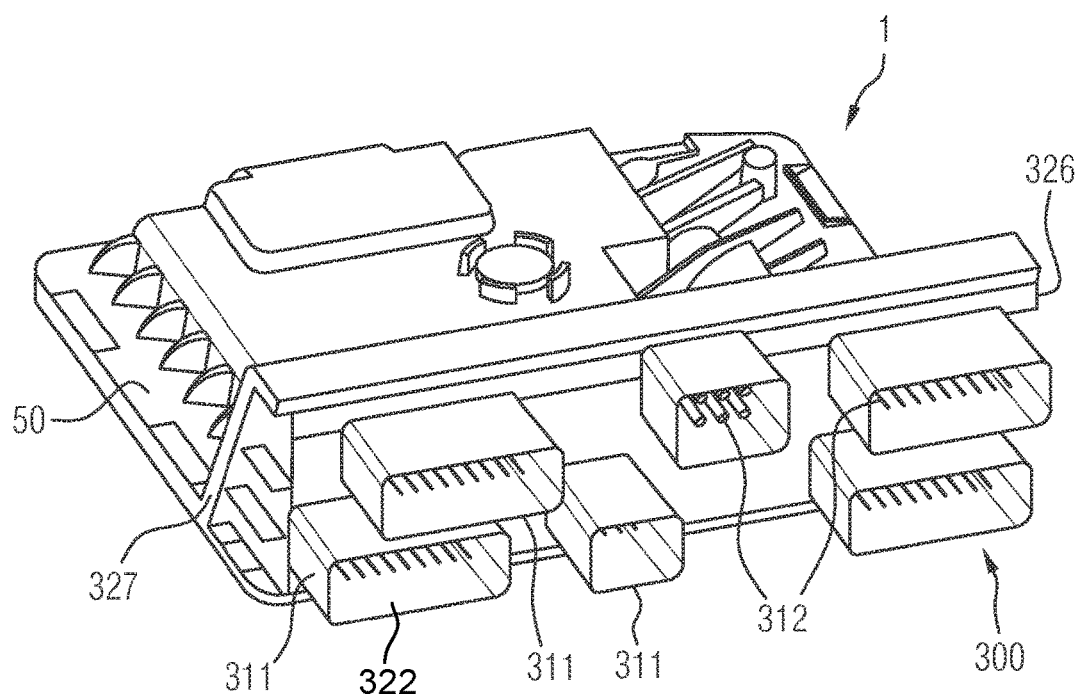
FIG. 4 shows a perspective view of an exemplary embodiment of a control unit with the installed circuit board assembly from FIG. 1.

As illustrated in detail in FIG. 4, the circuit board assembly 10 has the plug connector 300 and the housing faceplate 320. The housing faceplate 320 together with a housing component 50 forms a housing of a control unit 1. In the control unit 1, the circuit board 100 is arranged within the housing component 50. In the embodiment illustrated, the connection elements 310 are arranged in two rows. The plug connector 300 has a multiplicity of connection elements 310 with in each case one attachment part 311 and contact pins 312. The attachment parts 311 are arranged in a common enclosure 322 which projects out of the housing faceplate 320, and the contact pins 312 are electrically and mechanically connected to the second section 220. The contact pins 312 have a main direction of extent which runs perpendicular to the panel central plane 221 of the second section 220. In this way, a particularly space-saving connection of the contact pins 312 to the circuit board 100 can be achieved, and the connection between the circuit board 100 and the plug connector 300 can be produced particularly easily.

It is basically possible for a control unit 1 of said type, in particular an engine control unit and/or a transmission control unit in a Byte flight bus system of a vehicle, to have a housing and a circuit board assembly 10 according to the invention arranged in the housing, wherein the housing is preferably closed in hermetically sealed fashion.

Although the invention has been illustrated and described in more detail by way of the preferred exemplary embodiment, the invention is not limited by the disclosed examples, and further modifications and combinations of features in addition to the embodiment described and shown may be derived therefrom by a person skilled in the art without departing from the scope of protection of the invention.

The invention claimed is:

1. A circuit board assembly for a control unit of a motor vehicle, the assembly comprising:
   a multi-layer circuit board and a plug connector with a housing faceplate;
   said circuit board having optical conductor paths for conducting optical signals and/or electrical conductor paths for conducting electrical signals, said circuit board having a panel-shaped first section, a panel-shaped second section, and a flexible third section formed between said first and second sections, said third section having a lower stiffness than said first and second sections, and said third section mechanically and electrically connecting said first and second sections such that a first panel central plane of said first section encloses an angle φ with a second panel central plane of said second panel section;
   said plug connector having a multiplicity of connection elements each with an attachment part and at least one contact pin, said attachment parts being arranged in a common enclosure that projects out of said housing faceplate, and each said at least one contact pin being electrically and mechanically connected to said second section;
   said housing faceplate having first and second panel-shaped side elements, said side elements having panel central planes each enclosing an angle β with the first panel central plane and an angle γ with the second panel central plane;
   at least one of said first or second side elements having a first detent element configured to lock said housing faceplate on said first section of said circuit board and to compensate for restoring forces of said third section to prevent a change in the angle φ in a first direction of rotation; and
   at least one of said first or second side elements having a second detent element, generally equal distance from said panel-shaped second section as said first detent element, configured to prevent a change in the angle φ in a second direction of rotation.

2. The circuit board assembly according to claim 1, wherein said first detent element and said second detent element are arranged on said side element so as to receive between said first and second detent element the panel central plane of said first section.

3. The circuit board assembly according to claim 1, wherein the angle φ has a value between 10° and 170°.

4. The circuit board assembly according to claim 3, wherein the angle φ has a value between 30° and 150°.

5. The circuit board assembly according to claim 4, wherein the angle φ has a value between 70° and 110°.

6. The circuit board assembly according to claim 1, wherein said side elements have at least one sealing element for sealing the circuit board assembly with respect to a corresponding housing component of the control unit.

7. The circuit board assembly according to claim 6, wherein said sealing element is selected from the group consisting of an insert seal, a dispenser seal molded directly onto said side elements, and a dispenser seal molded directly onto a corresponding housing component of the control unit.

8. The circuit board assembly according to claim 1, wherein said first section of said circuit board is, in a plan view of the first panel central plane, arranged between said first and second side sections.

9. The circuit board assembly according to claim 1, wherein, in a plan view of the first panel central plane of said first section, said first and second side elements run parallel to those side edges of said first section that adjoin said third section.

10. The circuit board assembly according to claim 1, wherein said second section has, in a plan view of the second panel central plane, a substantially rectangular or trapezoidal outline.

11. The circuit board assembly according to claim 1, wherein said circuit board has at least one electrical component which is connected to at least one electrical conductor path, and wherein said electrical component is connected to said circuit board in said second section.

12. A control unit for a motor vehicle, comprising a circuit board assembly according to claim 1.

13. The control unit according to claim 12, wherein the housing of the control unit is a hermetically sealed housing.

14. A signal processing arrangement for a motor vehicle, the signal processing arrangement comprising:
   a circuit board assembly according to claim 1;
   a wire harness attached to said plug connector and connected electrically conductively to said second section by way of at least one said connection element.

\* \* \* \* \*